(12) United States Patent
Koga

(10) Patent No.: US 7,683,446 B2
(45) Date of Patent: Mar. 23, 2010

(54) MAGNETIC MEMORY USING SPIN INJECTION FLUX REVERSAL

(75) Inventor: Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 33 days.

(21) Appl. No.: 11/443,372

(22) Filed: May 31, 2006

(65) Prior Publication Data

US 2006/0266470 A1   Nov. 30, 2006

(30) Foreign Application Priority Data

May 31, 2005   (JP)   ............... P2005-160145

(51) Int. Cl.
*H01L 29/82* (2006.01)
*G11C 11/02* (2006.01)

(52) U.S. Cl. ............... 257/422; 257/421; 438/3; 365/158; 360/324; 360/324.1; 360/324.2

(58) Field of Classification Search ............... 257/2–5, 257/30, 421–427, 414, 108, E29.323; 360/324–326, 360/313; 438/900, 133, 3; 365/158, 149, 365/130, 129, 157, 171–173; 156/272.4; 427/127

See application file for complete search history.

(56) References Cited

U.S. PATENT DOCUMENTS

2004/0100855 A1* 5/2004 Saito et al. ............... 365/232
2005/0052903 A1* 3/2005 Hayashi ............... 365/158

FOREIGN PATENT DOCUMENTS

JP   A 2004-128430   4/2004

* cited by examiner

*Primary Examiner*—Thanh V Pham
*Assistant Examiner*—Jami M Valentine
(74) *Attorney, Agent, or Firm*—Oliff & Berridge, PLC

(57) ABSTRACT

A magnetization direction in a magnetosensing layer (5b) is perturbed near the magnetic connection between a magnetic yoke (5) and the magnetosensing layer (5b). If the magnetization direction of a region in the magnetosensing layer (5b) facing a fixed layer which functions during read is not perturbed, reliability is improved. In this magnetometric sensor, a surface area S1 of fixed layers (43, 44) is made smaller than a surface area S2 of the magnetosensing layer (5b) so that, in the region of the magnetosensing layer (5b) facing the fixed layer, the magnetization direction is perturbed less than in the surrounding region and reliability during data read is improved.

5 Claims, 18 Drawing Sheets

MAGNETIC MEMORY USING SPIN INJECTION FLUX REVERSAL

BACKGROUND OF THE INVENTION

1. Field of the Invention

The present invention relates to a magnetic memory and to a method of manufacturing same.

2. Related Background Art

In recent years, MRAM (Magnetic Random Access Memory) is attracting attention as a memory device for information processors such as computers and telecommunications devices. Since MRAM stores data by magnetism, it has the advantage that it does not suffer from the inconveniences associated with a volatile memory such as DRAM (Dynamic Random Access Memory) or SRAM (Static RAM), where information would be lost if for example the power supply were interrupted.

MRAM is dramatically superior as regards access speed, reliability and poser consumption compared to a nonvolatile storage means like a conventional flash EEPROM or a hard disk drive. Therefore, MRAM has the potential to assume all the functions of volatile memories such as DRAM and SRAM, and the functions of nonvolatile storage means such as flash EEPROM and hard disk drives.

MRAM comprises a magneto-resistance effect element using the TMR (Tunneling MagnetoResistance) effect or the GMR (Giant MagnetoResistance) effect. When writing data to MRAM current is passed through a write interconnection situated near the magneto-resistance effect element, the magnetization direction of a magnetosensing layer (free layer) in the magneto-resistance effect element changing due to the magnetic field generated by this current When reading data from MRAM, stored data is distinguished depending on the resistance of the magneto-resistance effect element when current is passed through a read interconnection electrically connected to the magneto-resistance effect element.

However, the magnetic field generated around the write interconnection may affect adjacent elements, and cause a malfunction. A magnetic yoke is therefore placed around the write interconnection in an attempt to inhibit the effect on adjacent elements (e.g., Patent document 1: JP-A No. 2004-128430).

SUMMARY OF THE INVENTION

However, the reliability of the aforesaid magnetic memory is not sufficiently high.

It is therefore an object of the invention, which was conceived to resolve this problem, to provide a reliable magnetic memory and a method of manufacturing same.

The magnetic memory according to the present invention, in order to solve the aforesaid problem, has plural storage areas in a two-dimensional array, each of the plural storage areas having a magneto-resistance effect element comprising a magnetosensing layer, nonmagnetic layer and fixed layer (pinned layer) laminated together, a magnetic yoke surrounding the circumference of a write interconnection which generates magnetic force lines supplied to the magnetosensing layer and a read interconnection electrically connected to the magneto-resistance effect element. In the magneto-resistance effect element, the surface area of the fixed layer is smaller man the surface area of the magnetosensing layer.

When a current is passed through the write interconnection, magnetic force lines are supplied to the magnetosensing layer via the magnetic yoke. Since the magnetic yoke surrounds the circumference of the write interconnection, it functions to suppress leakage of magnetic flux to adjacent elements and increase the magnetic flux density in the magnetosensing layer. The current flowing into the write interconnection may be smaller than in the case where there is no magnetic yoke. Since a current from the magneto-resistance effect element flows through the read interconnection, this current amount (resistance) depending on the magnetization direction of the magnetosensing layer, stored data can be read through the read interconnection.

Here, the magnetization direction in the magnetosensing layer is perturbed near the magnetic connection area of the magnetic yoke with the magnetosensing layer. If the magnetization direction of the region of the magnetosensing layer facing the fixed layer which functions during read, is not perturbed, reliability will be higher. Hence, in this magnetometric sensor, the surface area of the fixed layer is made smaller than the surface area of the magnetosensing layer, the magnetization direction in the part of the magnetosensing layer opposite the fixed layer is not perturbed as much as in the surrounding area, and reliability during data read is increased.

In the magnetic memory according to the present invention, the magnetosensing layer is formed on a substrate, the nonmagnetic layer is formed on the magnetosensing layer, and the fixed layer is formed on the nonmagnetic layer. Since the magnetosensing layer is on the substrate side, the surface area can be increased easily.

In the magnetic memory according to the present invention, the nonmagnetic layer is an insulator. In this case, the magneto-resistance effect element can be operated as a TMR element comprising the magnetosensing layer, the insulator and the fixed layer. The thickness of the nonmagnetic layer is set to a thickness at which a tunnel effect is produced.

In the magnetic memory according to the present invention, a write switch is electrically connected to the write interconnection. When the write switch is turned ON, a write current is supplied to the write interconnection.

In the magnetic memory according to the present invention, the read switch is electrically connected to the read interconnection. When the read switch is turned ON, a read current is extracted from the magneto-resistance effect element to the read interconnection.

In the magnetic memory according to the present invention, the write switch is a MOSFET (Metal-Oxide Semiconductor Field-Effect Transistor). In this case, ON/OFF of the MOSFET may be controlled by changing the potential applied to the gate electrode of the MOSFET.

In the method of manufacturing a magnetic memory according to the present invention having plural storage areas in a two-dimensional array, each of the plural storage areas having a magneto-resistance effect element comprising a magnetosensing layer, nonmagnetic layer and fixed layer laminated together, a magnetic yoke surrounding the circumference of the write interconnection which generates magnetic force lines supplied to the magnetosensing layer, and a read interconnection electrically connected to the magneto-resistance effect element, and wherein, in the magneto-resistance effect element, the surface area of the fixed layer is smaller than the surface area of the magnetosensing layer, there are provided steps for laminating the magnetosensing layer, nonmagnetic layer and fixed layer one by one on a substrate, forming a first photoresist on part of the surface of the fixed layer, and performing etching until the nonmagnetic layer or magnetosensing layer is exposed from the first photoresist on the fixed layer such that the surface area of the fixed layer is smaller than the surface area of the magnetosensing layer.

According to this manufacturing method, since the surface area of the fixed layer can be made smaller than the surface area of the magnetosensing layer using the photoresist, a reliable magnetometric sensor can be manufactured easily.

In the method of manufacturing the magnetic memory according to the present invention, the first insulating layer is formed on the first photoresist and the exposed surface after the etching step, the first photoresist being lifted off after a suitable time.

The first insulating layer formed on the first photoresist on the fixed layer is removed by lift-off, but the first insulating layer remains surrounding the fixed layer, and the part surrounding the fixed layer is thus protected by the first insulating layer.

In the method of manufacturing the magnetic memory according to the present invention, there are provided steps for forming a second photoresist on a surrounding surface so as to expose the surface of the fixed layer, depositing an interconnection material on the fixed layer from the second photoresist, and lifting off the second photoresist leaving the interconnection material so as to form a write interconnection.

In this case, the write interconnection is formed easily by lift-off.

In the method of manufacturing the magnetic memory according to the present invention, there are provided steps for forming the second insulating layer on the write interconnection and the surrounding surface, forming the third photoresist on the write interconnection, etching the second insulating layer from the third photoresist on the write interconnection, removing the third photoresist, and depositing a soft magnetic material on the second insulating layer remaining on the write interconnection and surrounding exposed surface so as to form a magnetic yoke.

In this case, the magnetic yoke surrounding the write interconnection which is magnetically linked with the magnetosensing layer can be formed while leaving the first insulating layer underneath the write interconnection and the second insulating layer in a lateral part and upper part.

In the method of manufacturing the magnetic memory according to the present invention, there is provided a step for forming a protective layer on the magnetic yoke. In this case, the magnetic yoke is protected by the protective layer.

The magnetic memory of the invention is highly reliable, and the method of manufacturing it is simple.

DESCRIPTION OF THE PREFERRED EMBODIMENTS

Hereafter, referring to the accompanying drawings, some aspects of a magnetic memory according to the invention and the method of manufacturing it will be described in detail. In the description, identical symbols are assigned to identical elements, and their description is not repeated.

Figure 1:
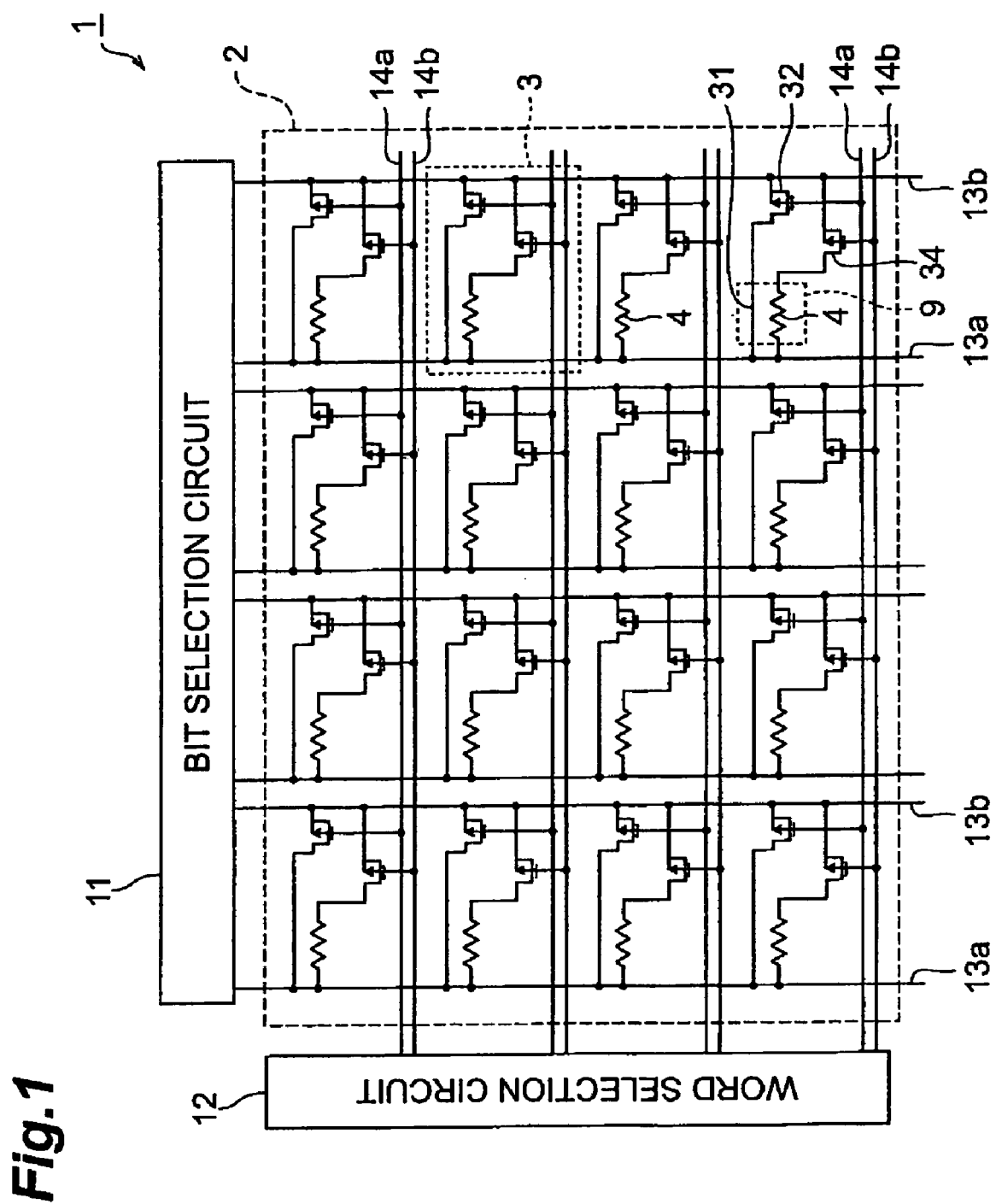
FIG. 1 is a circuit diagram of a magnetic memory 1 according to an aspect of the invention.
Figure 2:
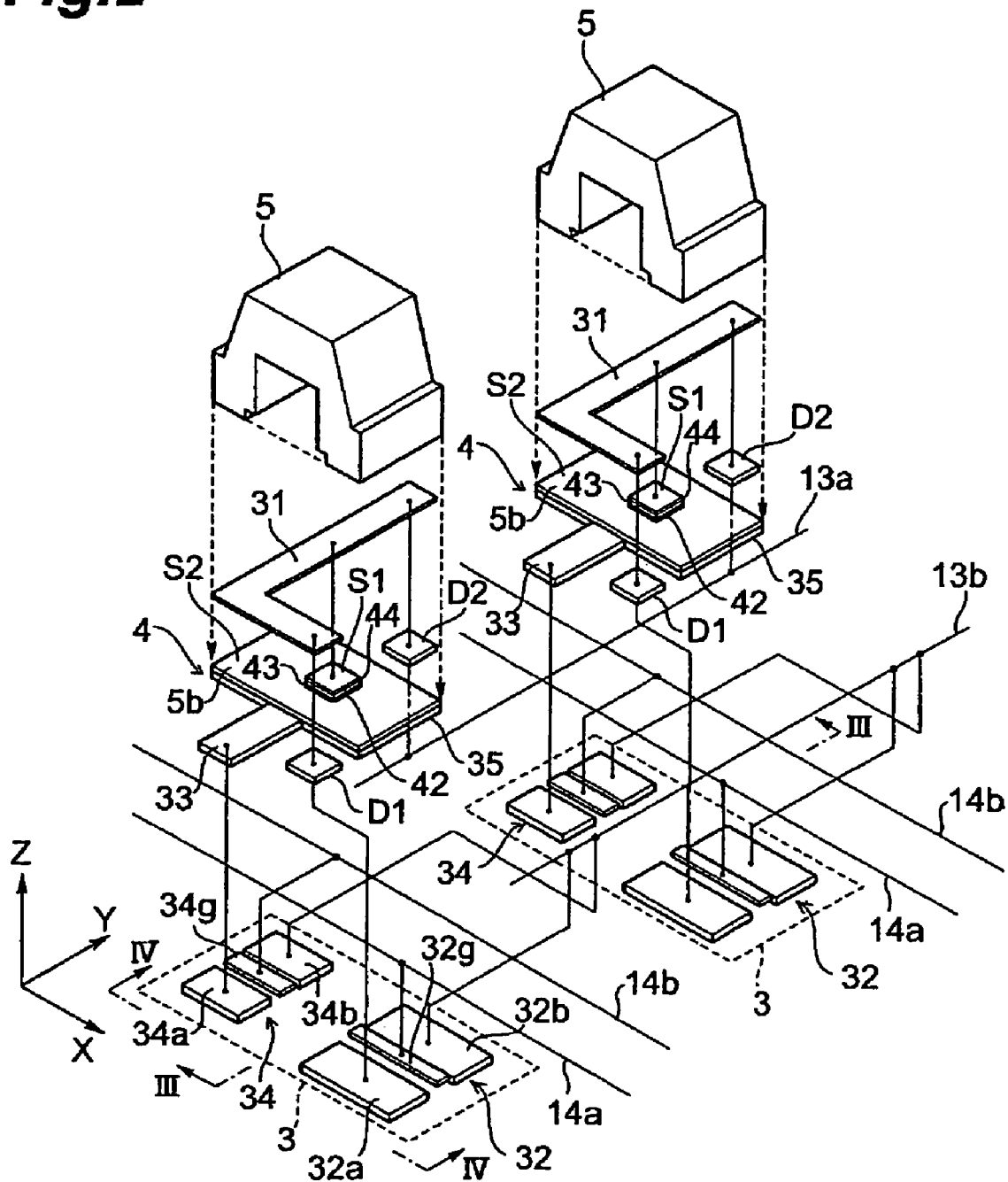
FIG. 2 is a schematic perspective view of a storage area 3 shown in FIG. 1.

FIG. 1 is a circuit diagram of a magnetic memory 1 according to this embodiment, and FIG. 2 is a schematic perspective view of a storage area 3 in FIG. 1.

The magnetic memory 1 comprises a storage part 2, bit selection circuit 11, word selection circuit 12, bit interconnections 13a, 13b and word interconnections 14a, 14b. The storage part 2 comprises plural storage areas 3. The plural storage areas 3 are disposed in a two-dimensional array of m lines and n rows (m and n are integers equal to 2 or more). The plural storage areas 3 each have a magnetic element part 9 comprising a TMR element 4, write interconnection 31, read interconnection 33, write transistor 32 and read transistor 34.

The TMR element 4 is a magneto-resistance effect element comprising a magnetosensing layer 5b having a magnetization direction which changes due to an external magnetic field. The TMR element 4 comprises the first magnetic layer (free layer) 5b which is the magnetosensing layer, second magnetic layers (fixed layers) 43, 44 having a fixed magnetization direction, and a nonmagnetic layer (insulating layer) 42 inserted between the magnetosensing layer 5b and fixed layers 43, 44.

The TMR element 4 is aligned with part of the write interconnection 31 so that the magnetization direction of the magnetosensing layer 5b changes in response to an external magnetic field generated according to a write current flowing through the write interconnection 31. When the magnetization direction of the magnetosensing layer 5b changes due to the write current, the resistance between the magnetosensing layer 5b and ferromagnetic layer 43 changes according to the relation between the magnetization direction of the magnetosensing layer 5b and the magnetization direction of the fixed layers 43, 44.

The memory 1 has a magnetic yoke 5 (FIG. 2) surrounding the circumference of the write interconnection 31 which generates magnetic force lines supplied to the magnetosensing layer 5b, and the read interconnection 33 which is electrically connected to the magneto resistance effect element (TMR element) 4. Here, a surface area S1 of the fixed layer (laminate of 43, 44) is smaller than a surface area S2 of the magnetosensing layer.

When a current is passed through the write interconnection 31, magnetic force lines are supplied to the magnetosensing layer 5b via the magnetic yoke 5. Since the magnetic yoke surrounds the circumference of the write interconnection, it functions to suppress leakage of magnetic flux to adjacent elements and increases the magnetic flux density in the magnetosensing layer 5b. The current flowing into the write interconnection 31 may be smaller than in the case where there is no magnetic yoke 5. Since the current from the TMR element 4 flows through the read interconnection, and this current amount (resistance) depends on the magnetization direction of the magnetosensing layer 5b, stored data can be read through the read interconnection 33.

Here, the magnetization direction in the magnetosensing layer 5b is perturbed in the vicinity of the magnetic connection of the magnetic yoke 5 with the magnetosensing layer 5b. If the magnetization direction of the part of the magnetosensing layer 5b facing the fixed layers which functions during read is not perturbed, reliability is improved. In this magnetometric sensor, the surface area S1 of the fixed layers 43, 44 is made smaller than the surface area S2 of the magnetosensing layer 5b, therefore the magnetization direction in the part of the magnetosensing layer 5b facing the fixed layers is not perturbed as much as in the surrounding region, and reliability during data read is improved. The fixed layers 43, 44 include the center of gravity of the magnetosensing layer 5b. The ratio of S1 to S2 is 1:2-1:50.

The write interconnection 31 is an interconnection for providing the magnetosensing layer 5b of the TMR element 4 with an external magnetic field due to the write current. A part of the write interconnection 31 is electrically connected to the bit interconnection 13a via an electrode D2. The other end of the write interconnection 31 is electrically connected to the source or drain of a write transistor 32. The write transistor 32 is a semiconductor write switch for controlling influx of write current to the write interconnection 31. In the write transistor 32, one of the drain or source is electrically connected to the interconnection 31, the other being electrically connected to the bit interconnection 13b. The gate of the write transistor 32 is electrically connected to the word interconnection 14a.

The read interconnection 33 is an interconnection for passing a current through the TMR element 4. More specifically, the read interconnection 33 is an interconnection which connects the bit interconnection 13b with the bit interconnection 13a via the TMR element 4. The read transistor 34 is a semiconductor read switch for controlling influx of read current to the read interconnection 33. One of the source and drain of the read transistor 34 is electrically connected to the magnetosensing layer 5b of the TMR element 4, the other of the source and drain being electrically connected to the bit interconnection 13b. The gate of the read transistor 34 is electrically connected to the word interconnection 14b. To permit independent control of the gates of the write transistor 32 and read transistor 34, write and read word interconnections are provided and respectively connected thereto.

The bit interconnections 13a, 13b are assigned corresponding to each row of the storage area 3. In this aspect, the bit interconnections 13a, 13b are first interconnections. The bit interconnection 13a is electrically connected to one end of the write interconnection 31 in the respective storage area 3 of the corresponding row. The bit interconnection 13a of this aspect is also electrically connected to one end of the read interconnection 33 in the respective storage area 3. The bit interconnection 13b is electrically connected to the drain or source of the write transistor 32 in the respective storage area 3 of the corresponding row. In this aspect, the word interconnections 14a, 14b are second interconnections. The word interconnections 14a, 14b are assigned to the storage area 3 of the corresponding line, and are electrically connected to gates which are the control terminals of the write transistor 32 and read transistor 34.

In this aspect, the bit selection circuit 11 is a write current generation means. The bit selection circuit 11 functions to provide a positive or negative write current to the write interconnection 31 of each storage area 3. More specifically, the bit selection circuit 11 comprises an address decoder circuit which selects a row corresponding to an address specified during data write from inside or outside the magnetic memory 1, and a current drive circuit which supplies a positive or negative write current between the bit interconnection 13a and bit interconnection 13b corresponding to the selected row. A word selection circuit 12 functions to select a line corresponding to the address specified during data write from inside or outside the magnetic memory 1, and to supply a control voltage to the word interconnections 14a, 14b corresponding to the selected line. The magnetic memory 1 having the aforesaid construction operates as follows.

When an address (line i, row j, $1 \leq i \leq m$, $1 \leq j \leq n$) to which data is to be written from inside or outside the magnetic memory 1 is specified, the bit selection circuit 11 and word selection circuit 12 respectively select the corresponding row j and line i. In the write transistor 32 of the storage area 3 in line i selected by the word selection circuit 12, a control voltage is applied to the gate via the word interconnection 14a so that a write current flows.

In the storage area 3 in row j selected by the bit selection circuit 11, a positive or negative voltage according to the data is applied between the bit interconnection 13a and bit interconnection 13b.

In the storage area 3 in row j selected by the bit selection circuit 11 and line i selected by the word selection circuit 12, a write current is generated in the interconnection 31 via the write transistor 32, and the magnetization direction of the magnetosensing layer 5b of the TMR element 4 is reversed by the magnetic field due to this write current. Hence, binary data is written to the storage area 3 of the specified address (line i, row j).

When an address from which data is to be read from inside or outside the magnetic memory 1 (line k, row 1), $1 \leq k \leq m$, $1 \leq l \leq n$) is specified, the bit selection circuit 11 and word selection circuit 12 respectively select the corresponding row 1 and line k. In the read transistor 34 of the storage area 3 in line k selected by the word selection circuit 12, a control voltage is applied to the gate via the word interconnection 14b so that a read current flows. A voltage for passing the read current between the bit interconnection 13a and bit interconnection 13b corresponding to row 1 selected by the bit selection circuit 11, is also applied from the bit selection circuit 11.

In the storage area 3 in row 1 selected by the bit selection circuit 11 and line k selected by the word selection circuit 12, a read current which flows through the read interconnection 33, flows to the bit interconnection 13b via the TMR element 4 and read transistor 34.

By distinguishing the voltage drop between the bit line 13a and bit line 13b in the TMR element 4, i.e., by distinguishing the resistance of the TMR element 4, the binary data stored in the storage area 3 of the specified address (line k, row 1) is read. If the value of the current is small, the resistance of the TMR element 4 is high, and if the value of the current is large, the resistance is low.

Figure 3:
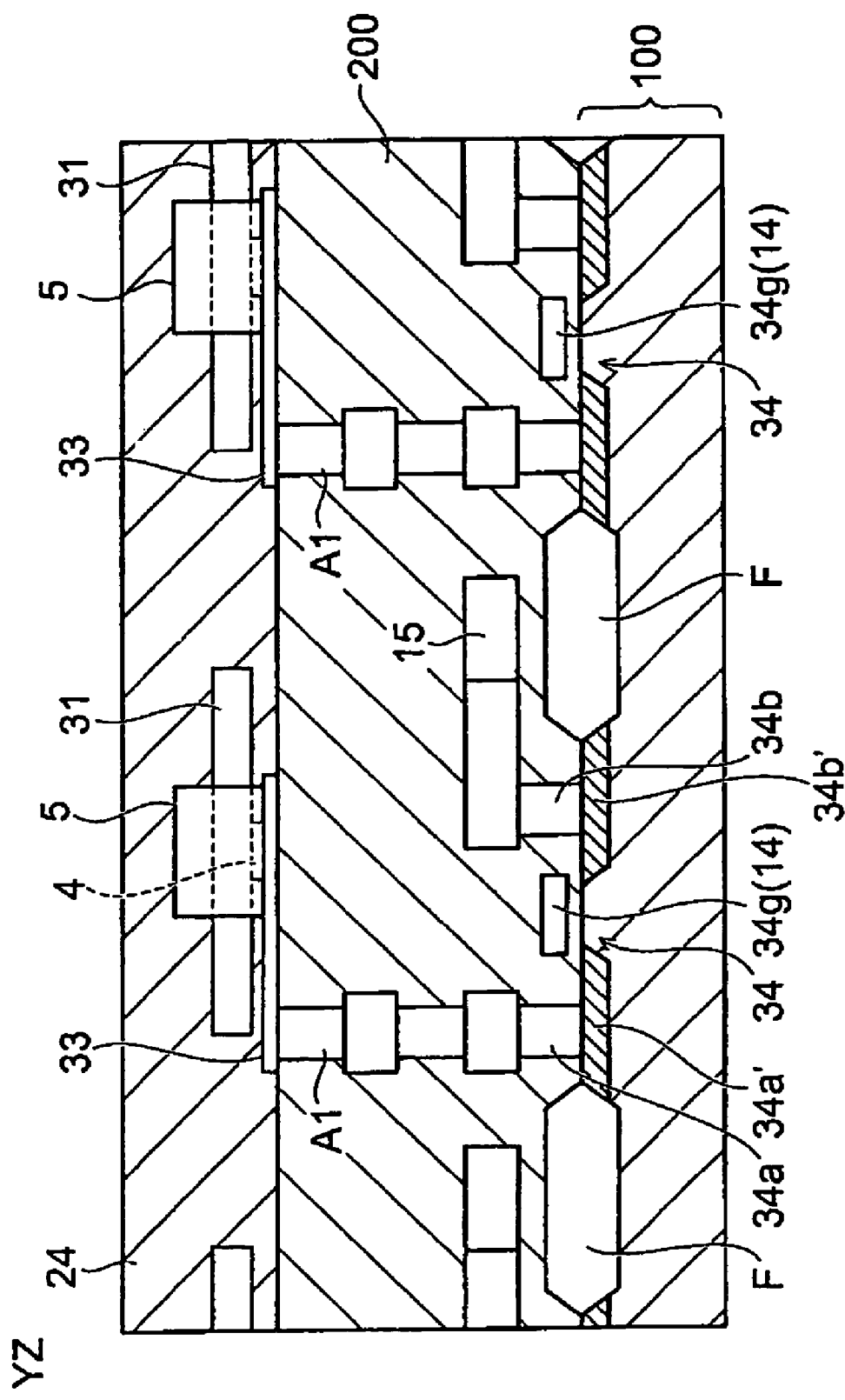
FIG. 3 is a cross-sectional view (YZ plane) through a line III-III of the storage area 3 shown in FIG. 2.

FIG. 3 is a cross-sectional view through a line III-III (YZ plane) of the storage area 3 shown in FIG. 2.

A lower electrode forming the read interconnection 33 is connected to a source or drain electrode 34a of the read transistor 34 via a vertical electrode A1 which passes through an insulating layer 200 formed on a semiconductor substrate 100 in the thickness direction. Here, the electrode 34a will be taken to be a drain electrode. The gate electrode 34g of the read transistor 34 forms the word interconnection 14b itself, or is connected to the word interconnection 14b. The read transistor 34 comprises the drain electrode 34a, source electrode 34b, gate electrode 34g, and drain region 34a', source region 34b' formed directly underneath the source electrode 34b, the drain electrode 34a and source electrode 34b being connected according to the potential of the gate electrode 34g. The source electrode 34b is connected to the word interconnection 13b.

Figure 4:
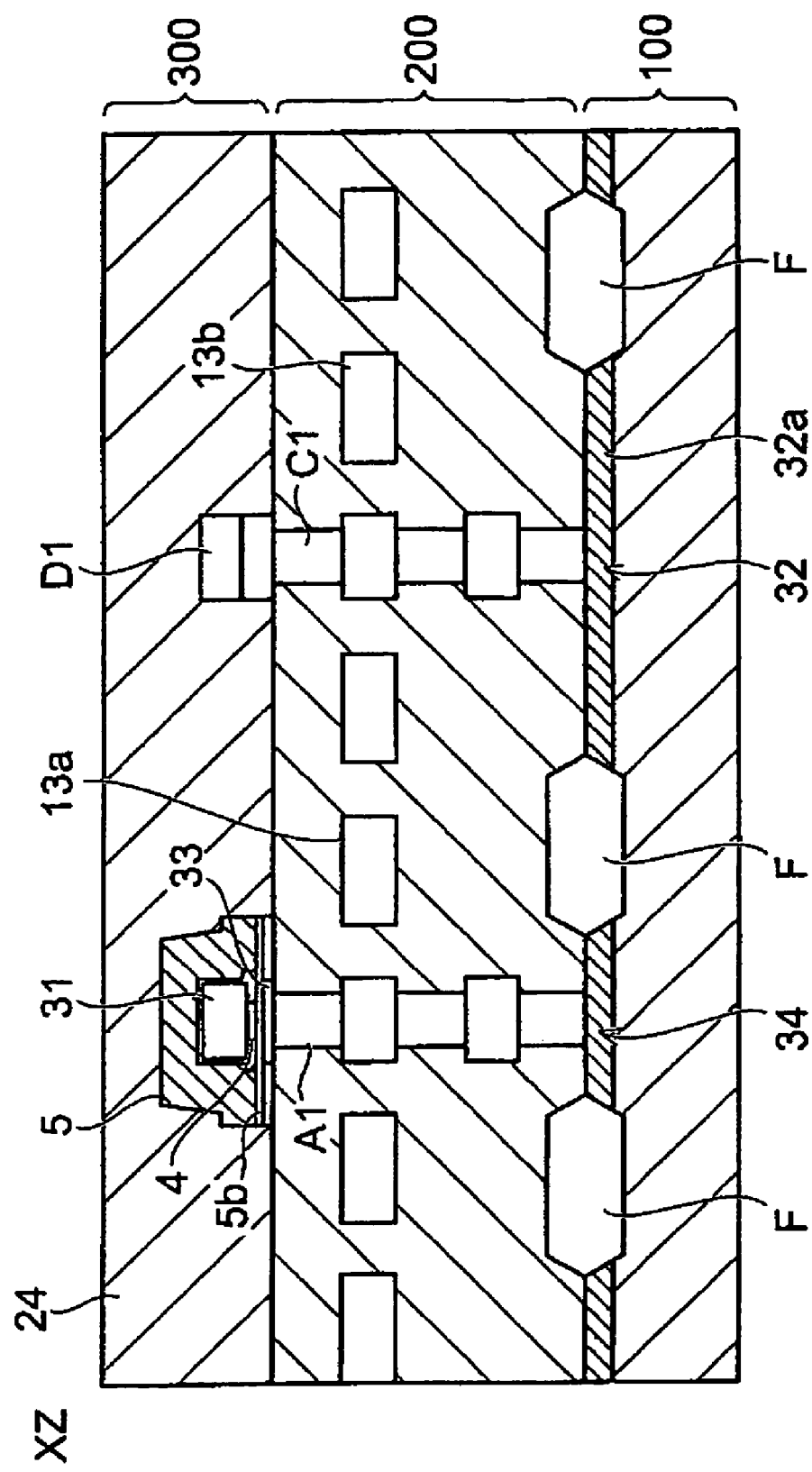
FIG. 4 is a cross-sectional view (XZ plane) through a line IV-IV of the storage area 3 shown in FIG. 2.

FIG. 4 is a cross-sectional view through a line IV-IV (XZ plane) of the storage area 3 shown in FIG. 2.

An oxide film ($SiO_2$)F is formed due to LOCOS (local oxidation of silicon) in the circumference of the read transistor 34 and write transistor 32. A source or drain region 32a of the write transistor 32 is connected to an electrode D1 via a vertical interconnection C1. The write transistor 32 also has source/drain electrodes 32a, 32b, and a gate electrode 32g (FIG. 2).

The bit interconnections 13a, 13b and word interconnections 14a, 14b are embedded in the lower insulating layer 200 formed on the semiconductor substrate 100, an upper insulating layer 24 being formed on the lower insulating layer 200. In the lower insulating layer 200, plural interconnections are provided if required. The vertical interconnections A1, C1 are interconnections extending through the lower insulating layer 200 from the surface of the semiconductor substrate 100, the electrode D1 being formed on the lower insulating layer 200. The semiconductor substrate 100 is made of Si, and conductive impurities which are different from the semiconductor substrate 100 are added to the source region and drain region. The lower insulating layer 200 is made of $SiO_2$ or the like.

Figure 5:
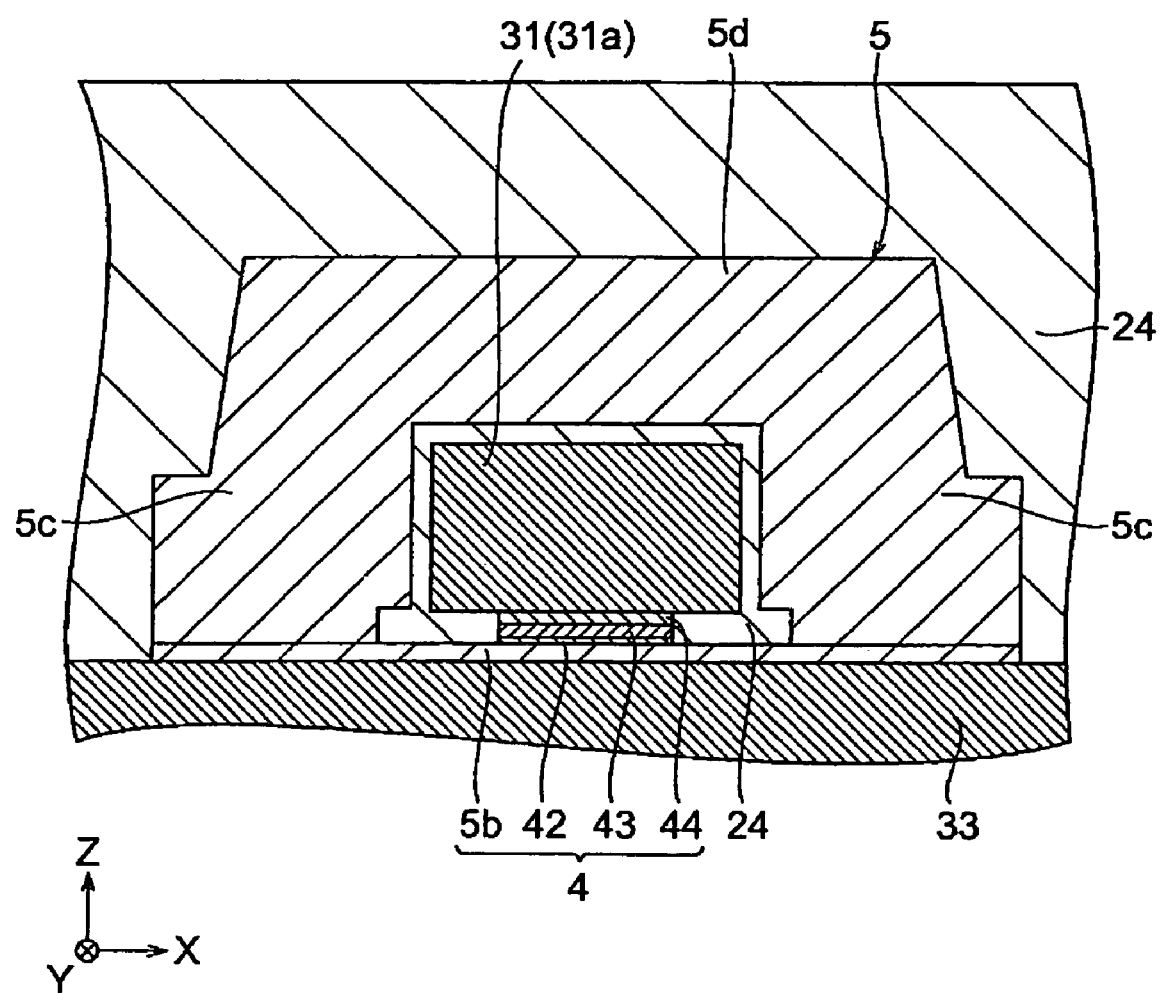
FIG. 5 is a cross-sectional view (XZ plane) of a magnetic element part near a TMR element.

FIG. 5 is a cross-sectional view (XZ plane) of the magnetic element part near the TMR element.

The TMR element 4 is formed by laminating the magnetosensing layer 5b on a nonmagnetic insulating layer 42, ferromagnetic layer 43 and antiferromagnetic layer 44 one by one. In the magnetosensing layer 5b, the magnetization direction changes due to the external magnetic field from the in-region interconnection 31 so that binary data can be recorded. In this aspect, the magnetosensing layer 5b is formed by part of the magnetic yoke 5 (beam yoke 5b). The material of the magnetosensing layer 5b is a ferromagnetic material, such as for example Co, CoFe, CoFe, NiFe, NiFeCo or CoPt.

In the ferromagnetic layer 43, the magnetization direction is fixed by the antiferromagnetic layer 44. More specifically, the magnetization direction of the ferromagnetic layer 43 is stabilized by a switched connection in the join surface between the antiferromagnetic layer 44 and ferromagnetic layer 43. The axis of easy magnetization of the ferromagnetic layer 43 is aligned with the axis of easy magnetization of the magnetosensing layer 5b. The material of the ferromagnetic layer 43 is a ferromagnetic material, such as for example Co, CoFe, CoFeB, NiFe, NiFeCo or CoPt The material of the antiferromagnetic layer 44 is IrMn, PtMn, FeMn, PtPdMn, NiO, or a material comprising any desired combination thereof.

The nonmagnetic layer 42 is a layer comprising a nonmagnetic, insulating material. By interposing the nonmagnetic insulating layer 42 between the magnetosensing layer 5b and ferromagnetic layer 43, a tunnel magneto-resistance effect (TMR) is produced between the magnetosensing layer 41 and ferromagnetic layer 43. An electrical resistance depending on the relation parallel or anti-parallel) of the magnetization direction of the magnetosensing layer 41 to the magnetization direction of the ferromagnetic layer 43, is thus produced between the magnetosensing layer 41 and the ferromagnetic layer 43. The material of the nonmagnetic insulating layer 42 is preferably, for example, an oxide or nitride of a metal such as Al, Zn or Mg.

The layer which stabilizes the magnetization direction of the ferromagnetic layer 43, instead of the antiferromagnetic layer 44, may be a third magnetic layer provided via a non-magnetic metal layer or a synthetic AF (antiferromagnetic) layer.

This third magnetic layer further stabilizes the magnetization direction of the ferromagnetic layer 43 by forming an antiferromagnetic linkage with the ferromagnetic layer 43. Also, the effect of the static magnetic field of the ferromagnetic layer 43 on the magnetosensing layer 5b is prevented, so flux reversal of the magnetosensing layer 5b is facilitated.

The material of the third magnetic layer is not particularly limited, but is preferably a ferromagnetic material such as Co, CoFe, CoFeB, NiFe, NiFeCo or CoPt, each of which may be used alone or in combination with each other. The material of the non-magnetic metal layer between the ferromagnetic layer 43 and the third magnetic layer is preferably Ru, Rh, Ir, Cu or Ag. To obtain a strong antiferromagnetic linkage between the ferromagnetic layer 43 and the third magnetic layer, the thickness of the non-magnetic metal layer is preferably 2 nm or less.

The magnetic yoke 5 is formed from the first beam yoke 5b, a pair of pillar yokes 5c and a second beam yoke 5d. Among these, the first beam yoke 5b also comprises the magnetosensing layer of the TMR element 4, and is disposed between the read interconnection 33 and nonmagnetic insulating layer 42. One end of the first beam yoke 5b is connected to one of the pair of pillar yokes 5c, the other end of the first beam yoke 5b being connected to the other of the pair of pillar yokes 5c.

The second beam yoke 5d is aligned with the surface of the in-region interconnection 31 on the opposite side to the TMR element 4. The pair of pillar yokes 5c is aligned with a lateral surface of the interconnection 31, and connects the two ends of the first beam yoke 5b to the two ends of the second beam yoke 5d. Due to the above construction, the first beam yoke 5b, pair of pillar yokes 5c and second beam yoke 5d completely (continuously) surround the circumference of the interconnection 31 in part of the extension direction of the in-region interconnection 31 (interconnection part 31a on the TMR element 4). The first magnetic layer of the TMR element 4 is formed by part of the magnetic yoke 5 (first beam yoke 5b).

The material forming the magnetic yoke 5 is preferably a metal containing at least one element selected from among Ni, Fe and Co. The magnetic yoke 5 is preferably formed so that the axis of easy magnetization is aligned with the axis of easy magnetization of the magnetosensing layer of the TMR element 4.

The material of the insulating region 24 may be $SiO_2$.

Referring to FIGS. 6A, 6B, 7A and 7B, the operation around the TMR element 4 in the storage area 3 of this aspect will now be described.

Figure 6A:
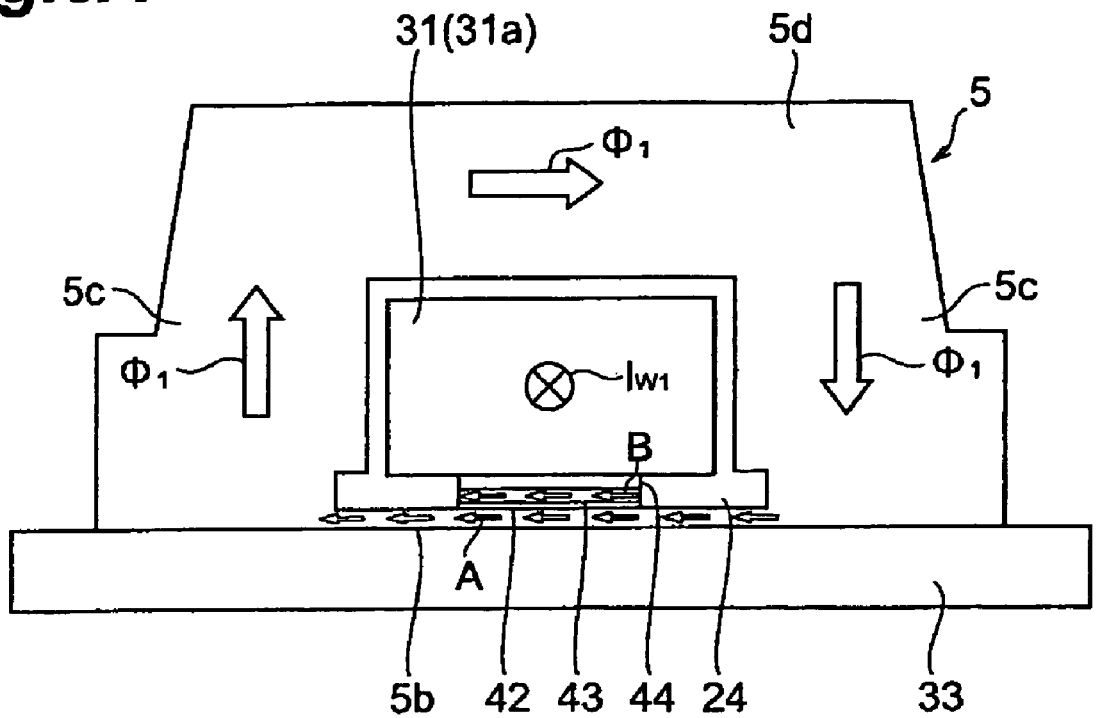
FIGS. 6A and 6B are diagrams showing the operation around the TMR element in the storage area.

As shown in FIG. 6A, when a negative write current $Iw_1$ flows into the interconnection 31, a magnetic field $\phi_1$ is generated around the interconnection part 31a of the interconnection 31, in the circumferential direction of the interconnection part 31a. The magnetic field $\phi_1$ forms a closed path around the core of the magnetic yoke 5 surrounding the interconnection part 31a.

When the magnetic field $\phi_1$ is generated around the interconnection part 31a, the magnetic field $\phi_1$ (external magnetic field) is efficiently supplied to the first magnetic layer (first beam yoke) 5b of the TMR element 4 due to the magnetic field enclosing action of the magnetic yoke 5, and magnetic force lines penetrate it. Due to this magnetic field $\phi_1$, the magnetization direction A of the magnetosensing layer 5b is the same circumferential direction as that of the magnetic field $\phi_1$. Here, if the magnetization direction B of the ferromagnetic layer 43 is already the same circumferential direction as that of the magnetic field $\phi_1$ due to the switching linkage with the antiferromagnetic layer 44, the magnetization direction A of the magnetosensing layer 5b and the magnetization direction B of the ferromagnetic layer 43 will be in the same direction, i.e., parallel to each other. Hence, a binary data (e.g., 0) is written to the TMR element 4.

Figure 6B:
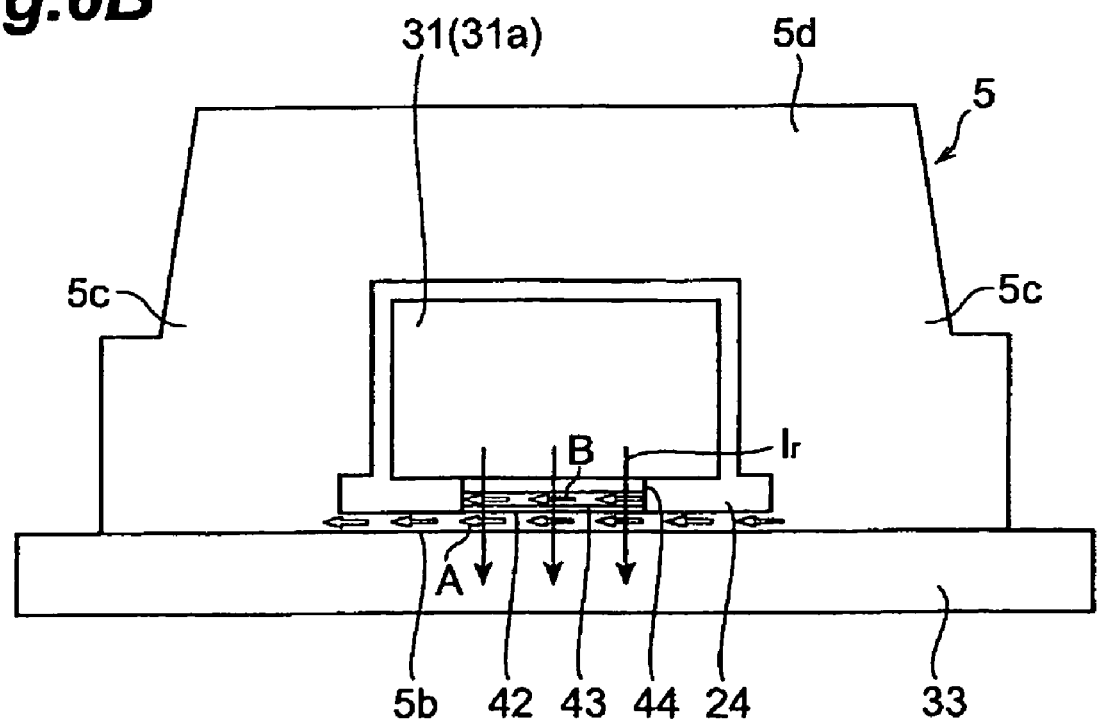

When reading data written to the TMR element 4, as shown in FIG. 6B, a read current $I_r$ is passed between the interconnection part 31a and read interconnection 33, and the change of current value or the change of potential difference between the interconnection part 31a and read interconnection 33 is detected. Hence, it is possible to distinguish which binary data the TMR element 4 is recording (i.e., whether the magnetization direction A of the magnetosensing layer 5b and the magnetization direction B of the ferromagnetic layer 43 are parallel or anti-parallel). For example, if the magnetization direction A of the magnetosensing layer 5b and the magnetization direction B of the ferromagnetic layer 43 are parallel, the resistance between the magnetosensing layer 5b and ferromagnetic layer 43 is relatively small due to the tunnel magneto-resistance effect (TMR) in the nonmagnetic insulating layer 42. Therefore, it may be appreciated that if for example the read current $I_r$ is set constant, since the potential difference between the interconnection part 31a and the read interconnection 33 is relatively small, the binary data written to the TMR element 4 will be 0.

Figure 7A:
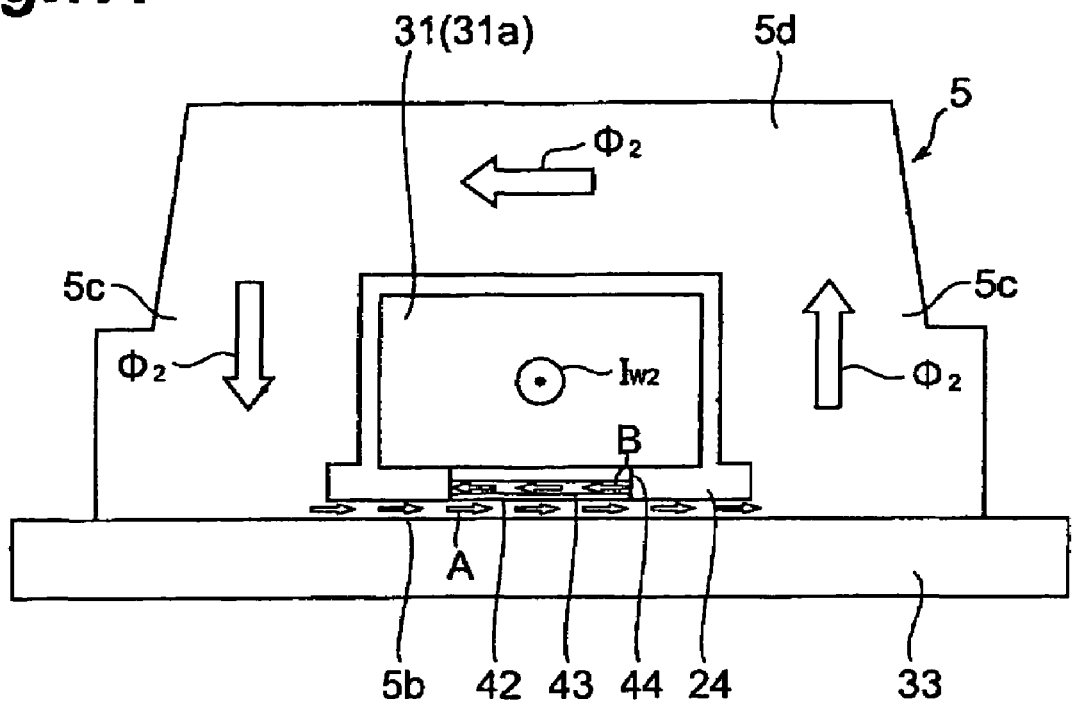
FIGS. 7A and 7B are diagrams showing the operation around the TMR element in the storage area.
Figure 7B:
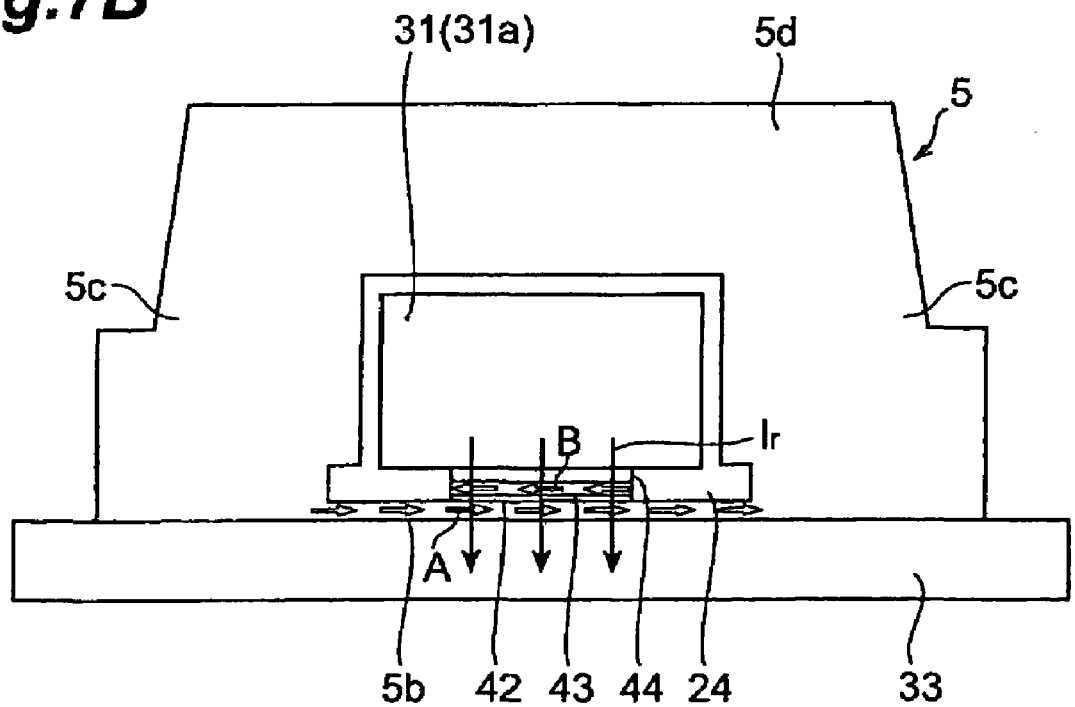

Also, as shown in FIG. 7A, when a positive write current $Iw_2$ flows through the interconnection 31, a magnetic field $\phi_2$ opposite to the magnetic field $\phi_1$ is generated around the interconnection part 31a of the interconnection 31. The magnetic field $\phi_2$ forms a closed path around the core of the magnetic yoke 5.

When the magnetic field $\phi_2$ is generated around the interconnection part 31a, the magnetic field $\phi_2$ (external magnetic field) is efficiently supplied to the magnetosensing layer 5b (first beam yoke 5b) of the TMR element 4 due to the magnetic field enclosing action of the magnetic yoke 5. Due to the magnetic field $\phi_2$, the magnetization direction A of the magnetosensing layer 5b is the same direction as that of the magnetic field $\phi_2$. Here, if the magnetization direction B of the ferromagnetic layer 43 is in the opposite direction to that of the magnetic field $\phi_2$, the magnetization direction A of the magnetosensing layer 5b and the magnetization direction B of the ferromagnetic layer 43 will be mutually opposite, i.e., anti-parallel. Hence, another data (e.g., 1) is written to the TMR element 4.

When the magnetization direction A of the magnetosensing layer 5b and the magnetization direction B of the ferromagnetic layer 43 are anti-parallel, the resistance between the magnetosensing layer 5b and ferromagnetic layer 43 is relatively large due to the tunnel magneto-resistance effect (TMR) in the nonmagnetic insulating layer 42. Therefore, if the fixed read current $I_r$ is passed between the interconnection part 31a and the interconnection 33 as shown for example in FIG. 7B, the potential difference between the interconnection part 31a and interconnection 33 is relatively large. Due to this, the binary data written to the TMR element 4 will be 1.

Figure 8:
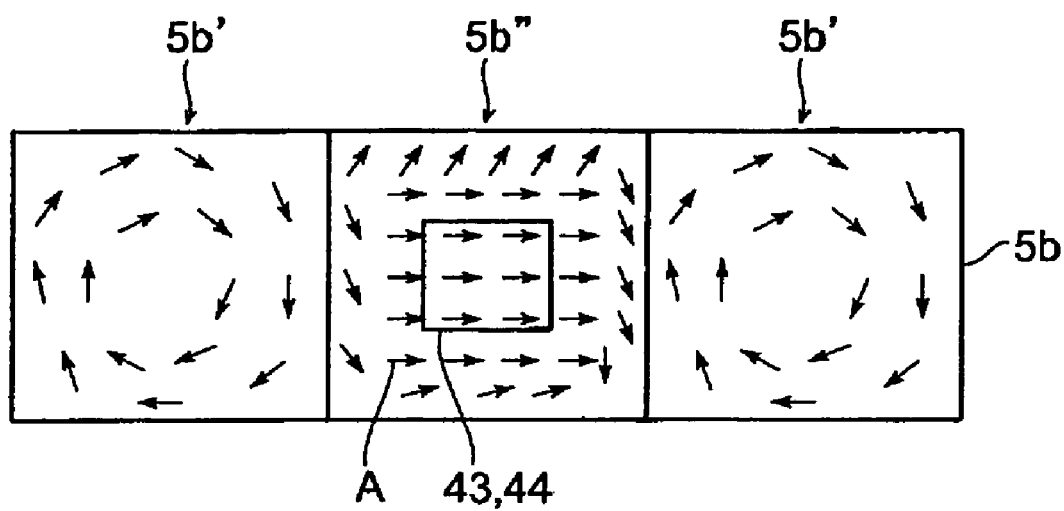
FIG. 8 is a plan view of a magnetosensing layer.

FIG. 8 is a plan view of the magnetosensing layer 5b showing the magnetization direction A in the magnetosensing layer 5b.

The fixed layers 43, 44 are situated in the center of magnetosensing layer 5b, and since they also have a small surface area, a perturbance is not produced in the magnetization direction A. 5b' are regions of the magnetosensing layer 5b facing the pillar yokes 5c of the magnetic yoke 5, and 5b'' is a region between the pair of regions 5b'. In the region 5b', the magnetization direction A is spiral. In the part of the magnetosensing layer 5b facing the fixed layers 43, 44, the magnetization direction A is perturbed less than in the surrounding region, so reliability during data read is improved.

Figure 9:
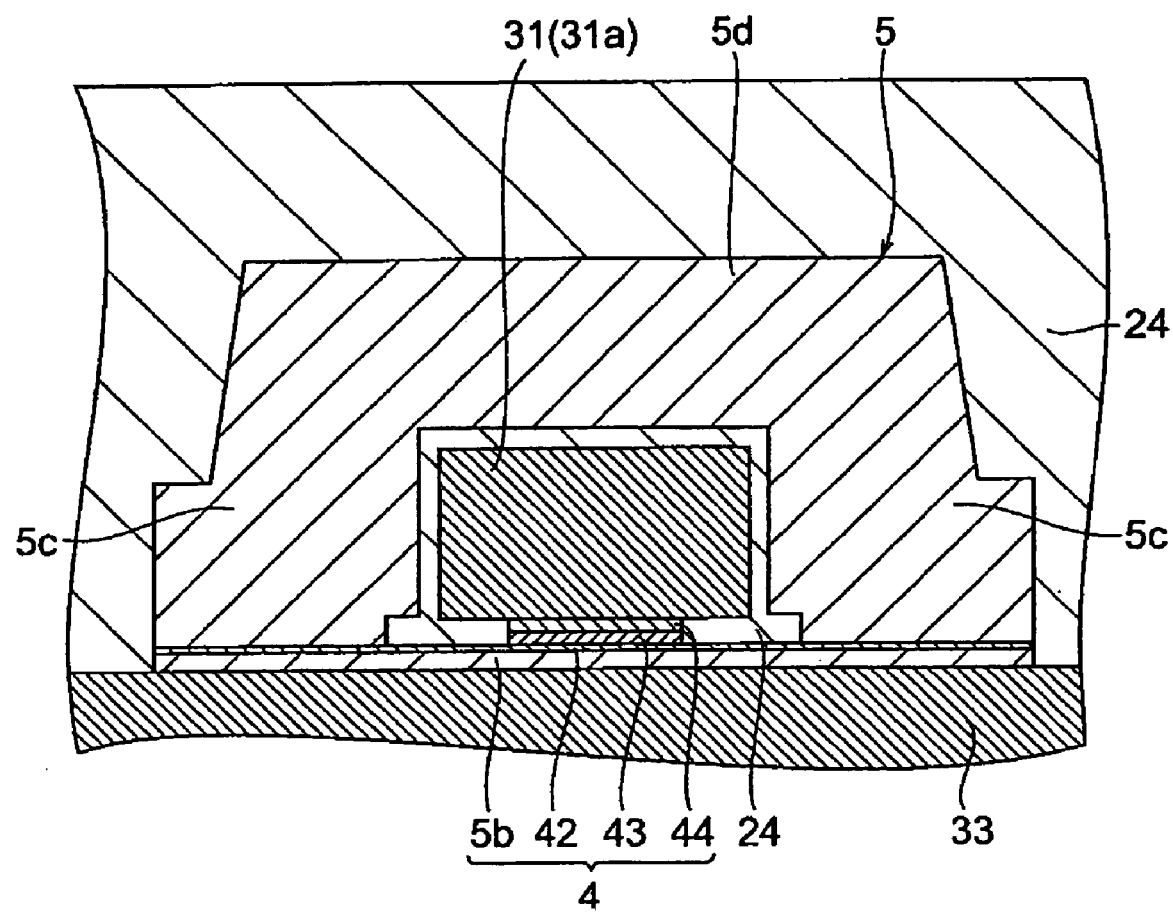
FIG. 9 is a cross-sectional view (XZ plane) of a magnetic element part near the TMR element according to a modification of the TMR element shown in FIG. 5.

FIG. 9 is a partial view (XZ plane) of the magnetic element part near the TMR element according to a modification of the TMR element shown in FIG. 5.

In this aspect, as compared to FIG. 5, the surface area of the nonmagnetic insulating layer 42 is larger, and it is interposed between the pillar yokes 5c and magnetosensing layer 5b of the magnetic yoke 5. In this case, perturbance in the magnetization of the magnetosensing layer 5b is prevented, the magnetization direction is stabilized and reliability is improved. Further, the insulating layer between the pillar yokes 5c, second beam yoke 5d and write interconnection 31 may be omitted, so the process is simplified. Since no step for removing the nonmagnetic insulating layer 42 is required, manufacture is easy.

Figure 10:
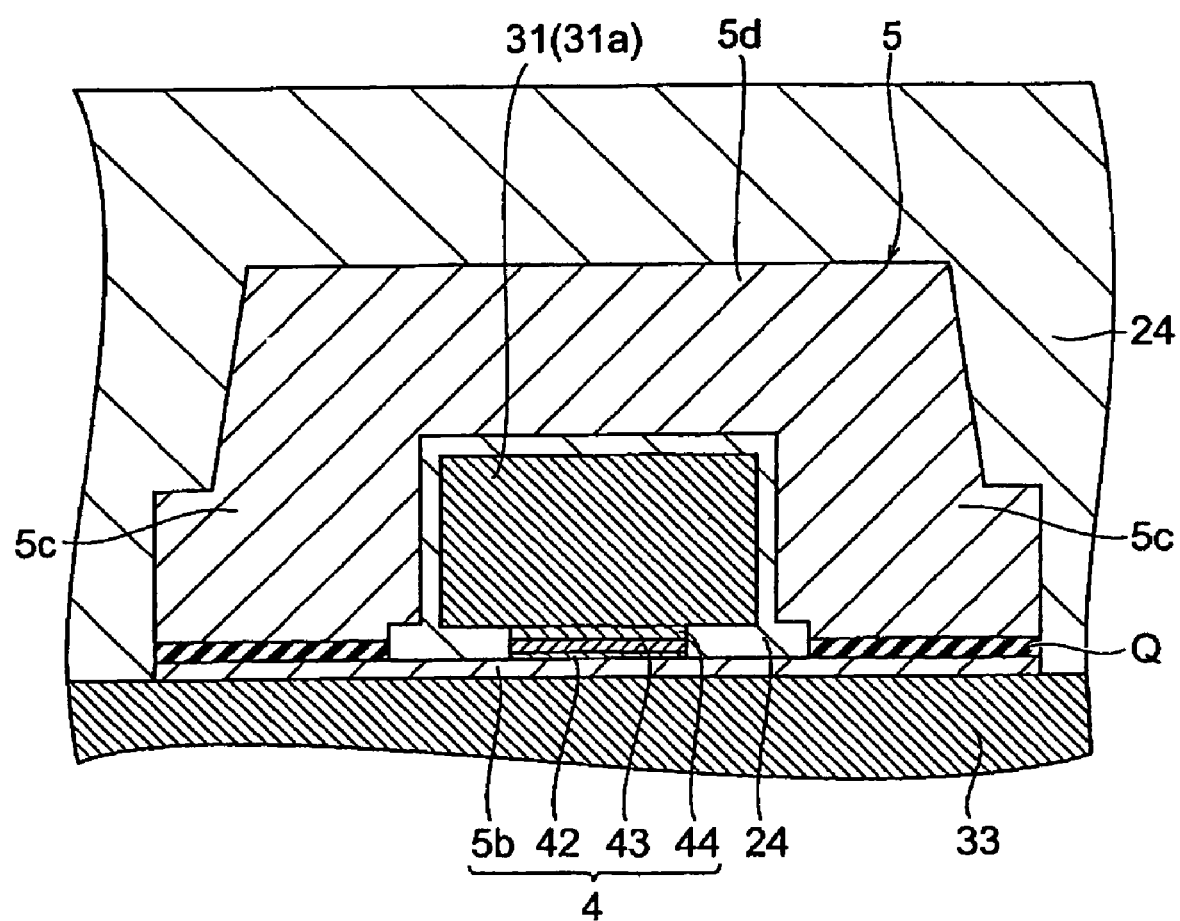
FIG. 10 is a cross-sectional view (XZ plane) of a magnetic element part near the TMR element according to another modification of the TMR element shown in FIG. 5.

FIG. 10 is a partial view (XZ plane) of the magnetic element part near the TMR element according to another modification of the TMR element shown in FIG. 5.

In this aspect, as compared to FIG. 5, an insulating layer Q is interposed between the pillar yokes 5c and magnetosensing layer 5b of the magnetic yoke 5. In this case, perturbance in the magnetization of the magnetosensing layer 5b is prevented, the magnetization direction is stabilized and reliability is improved. Since the insulating layer between the pillar yokes 5c, second beam yoke 5d and write interconnection 31 may be omitted, the process is simplified. Further, since the thickness of the insulating layer Q can be controlled independently of the thickness of the nonmagnetic insulating layer 42, gap control is easy.

Figure 11:
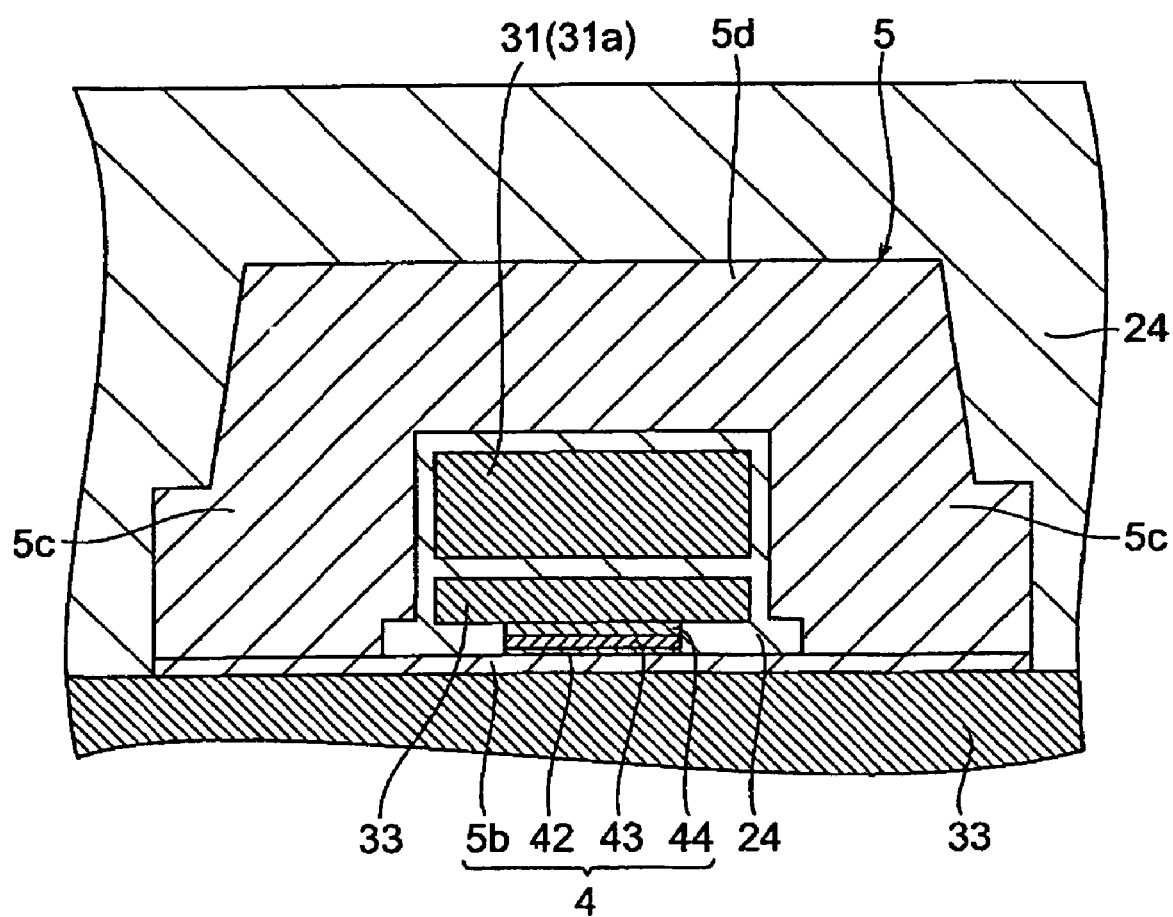
FIG. 11 is a cross-sectional view (XZ plane) of a magnetic element part near the TMR element according to yet another modification of the TMR element shown in FIG. 5.

FIG. 11 is a partial view (XZ plane) of the magnetic element part near the TMR element according to another modification of the TMR element shown in FIG. 5.

In this aspect, as compared to FIG. 5, the read interconnection 33 is provided underneath the write interconnection 31. The invention may be applied also in this case.

Figure 12:
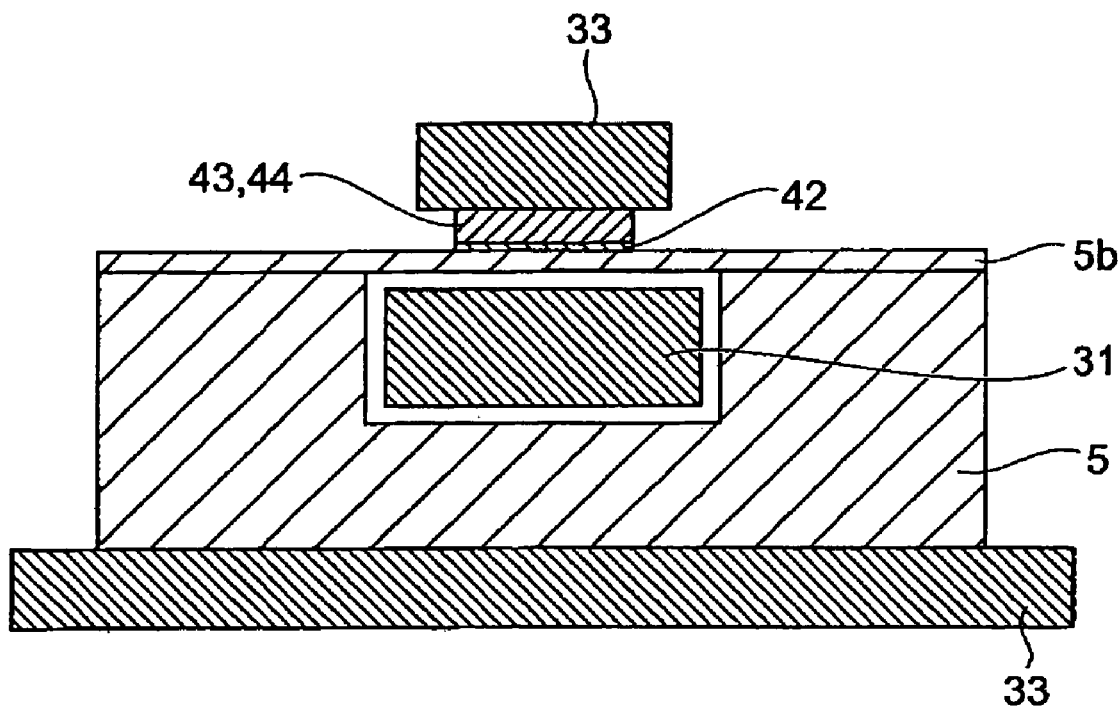
FIG. 12 is a cross-sectional view (XZ plane) of a magnetic element part near the TMR element according to yet another modification of the TMR element shown in FIG. 5.

FIG. 12 is a partial view (XZ plane) of the magnetic element part near the TMR element according to another modification of the TMR element shown in FIG. 5.

In this aspect, the magnetic yoke 5 lies under the magnetosensing layer 5b, and the write interconnection 31 is formed in the magnetic yoke 5. The nonmagnetic insulating layer 42 and fixed layers 43, 44 are laminated one by one on the surface of the magnetosensing layer 5b, and the read electrode 33 is provided thereupon. The read electrode 33 is provided also underneath the magnetic yoke 5. Data read is performed by detecting the current flowing from the upper read electrode 33 to the lower read electrode 33.

Figure 13:
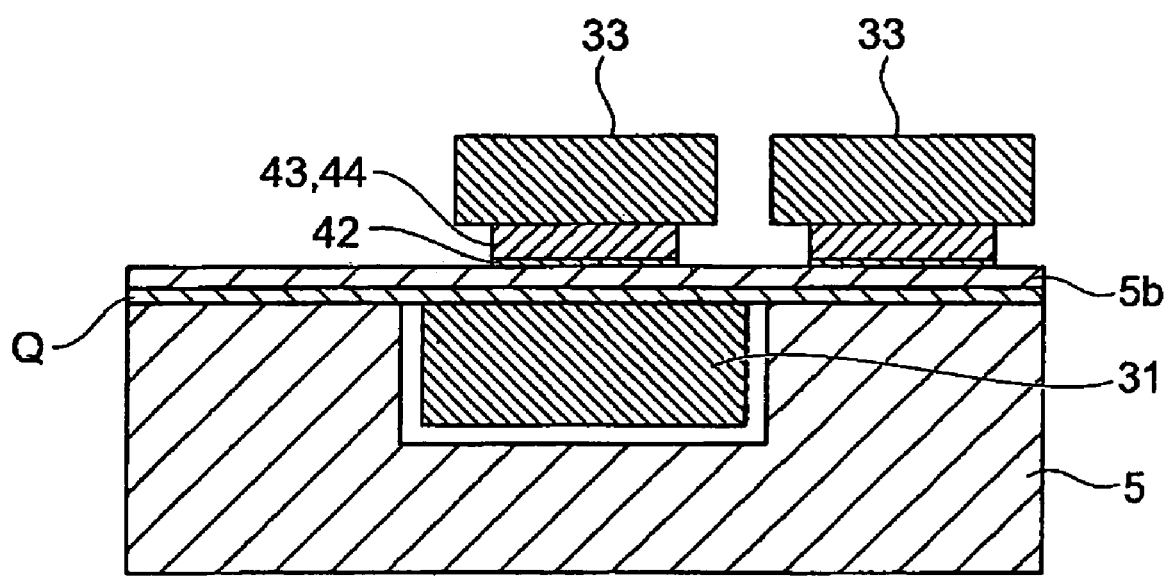
FIG. 13 is a cross-sectional view (XZ plane) of a magnetic element part near the TMR element according to a modification of the TMR element shown in FIG. 12.

FIG. 13 is a partial view (XZ plane) of the magnetic element part near the TMR element according to another modification of the TMR element shown in FIG. 12.

In this aspect, the lower read electrode 33 shown in FIG. 12 is moved onto the magnetosensing layer 5b adjacent to the read electrode 33 on the nonmagnetic insulating layer 42, electrical contact between the magnetosensing layer 5b and magnetic yoke 5 being broken by the insulating layer Q interposed therebetween. Data read is performed by detecting the current flowing from the read electrode 33 on the nonmagnetic insulating layer 42 to the adjacent read electrode 33 via the nonmagnetic insulating layer 42.

Next, a method of manufacturing the magnetic memory will be described. The aforesaid MOSFET and vertical interconnection are formed on a Si substrate, and after a suitable time, the interconnection 33, etc. is formed. After forming the interconnection 33, the TMR element part is formed.

FIGS. 14A, 14B, 14C, 14D and 14E are diagrams for describing the process of forming the TMR element part of the element shown in FIG. 5.

Figure 14A:
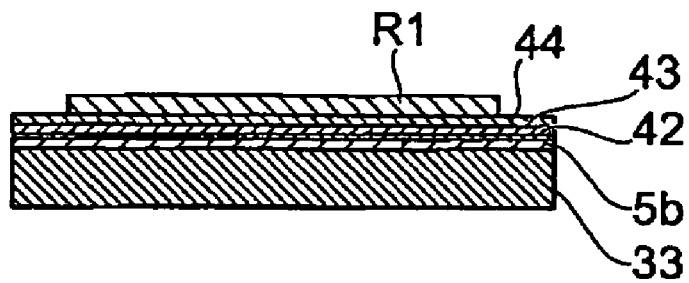
FIGS. 14A, 14B, 14C, 14D and 14E are diagrams showing steps for forming the TMR element part of the element shown in FIG. 5.

First, the magnetosensing layer 5b, nonmagnetic insulating layer 42, ferromagnetic layer 43, antiferromagnetic layer 44 and photoresist R1 are formed one by one on a copper electrode forming the interconnection 33 (FIG. 14A). The magnetosensing layer 5b and nonmagnetic insulating layer 42 are formed by forming a base layer (Ta), NiFe layer, CoFe layer and Al layer one by one, and after a suitable time, oxidizing the Al to form the nonmagnetic insulating layer 42 of $Al_2O_3$. The ferromagnetic layer 43 is formed by a CoFe layer, the antiferromagnetic layer 44 is formed by an IrMn layer, and if required, a Ta protective layer is formed thereupon one by one. The magnetosensing layer 5b is patterned in the same shape (rectangular) as the projection of the magnetic yoke 5 on the magnetosensing layer 5b by a photoresist and dry etching (ion milling).

Figure 14B:
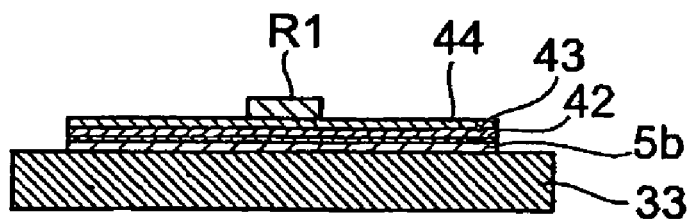

Next, a photoresist R1 is patterned in the shape of a minute rectangle (FIG. 14B). Exposure and development are performed, and as a result, the photoresist R1 is formed on part of the surface of the fixed layers 43, 44.

Figure 14C:
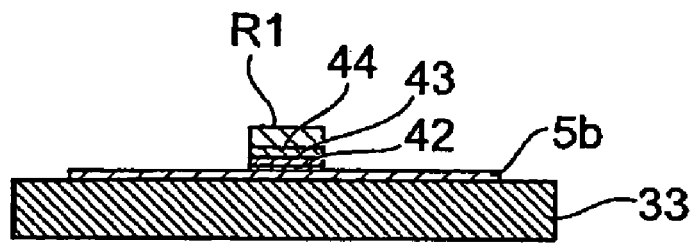
Figure 14D:
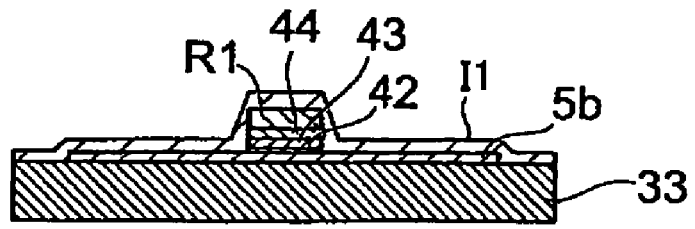

Next, etching is performed from the first photoresist R1 on the fixed layers 43, 44 until the nonmagnetic layer 42 or magnetosensing layer 5b is exposed such that the surface area of the fixed layers 43, 44 is smaller than the surface area of the magnetosensing layer 5b (FIG. 14C). This etching is dry etching (ion milling). According to this manufacturing method, the surface area of the fixed layer can be made smaller than the surface area of the magnetosensing layer using the photoresist R1, so a reliable magnetometric sensor can be manufactured easily.

Figure 14E:
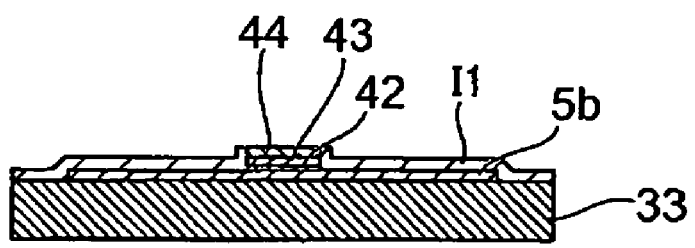

Next, an insulating layer I1 such as $SiO_2$ or the like is formed by sputtering or the like on the photoresist R1 and the surrounding exposed surface after the etching step (FIG. 14D), and after a suitable time, the photoresist R1 is lifted off (FIG. 14E). Although part of the insulating layer I1 formed on the photoresist R1 which is on the fixed layer is removed by lift-off, the insulating layer I1 around the fixed layers 43, 44 remains, the surrounding part of the fixed layers 43, 44 being protected by the insulating layer I1.

Next, the interconnection parts are formed.

Figure 15A:
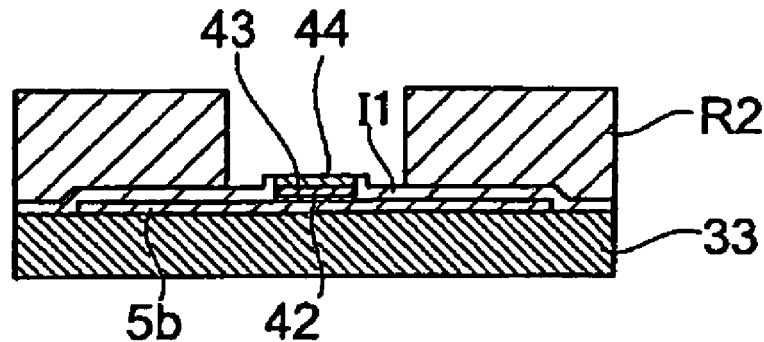
FIGS. 15A, 15B and 15C are diagrams showing steps for forming an interconnection part of the element shown in FIG. 5.
Figure 15B:
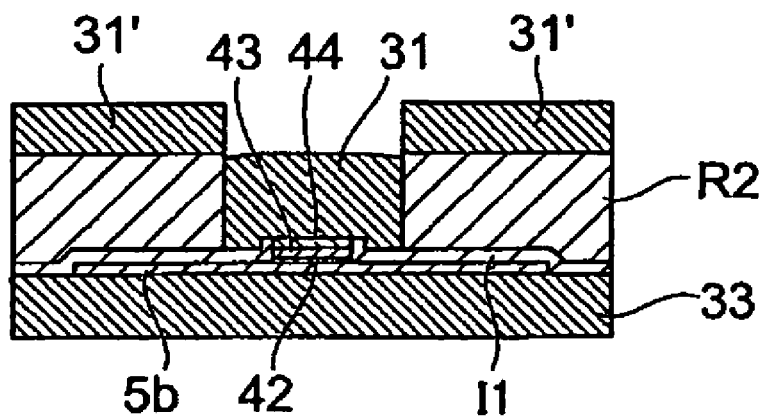
Figure 15C:
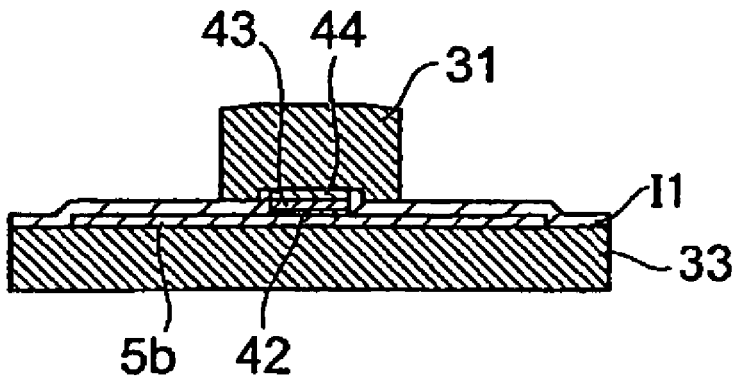

FIGS. 15A, 15B and 15C are diagrams showing steps for forming the interconnection parts of the element shown in FIG. 5.

First, a photoresist R2 is formed on the surface of the circumference so that the surface of the fixed layers 43, 44 is exposed (FIG. 15A).

Next, the interconnection materials 31, 31' are deposited on the fixed layers 43, 44 from the photoresist R2 (FIG. 15B). Specifically, a Ti layer, Cu layer and Ta layer are laminated one by one. The photoresist R2 is lifted off leaving the required interconnection material 31, and the unnecessary interconnection material 31' is removed to form the write interconnection 31 (FIG. 15C). The write interconnection 31 is formed easily by this lift-off.

Next, the yoke parts are formed.

FIGS. 16A, 16B, 16C, 16D, 16E, 16F and 16G are diagrams showing steps for forming the yoke parts of the element in FIG. 5.

Figure 16A:
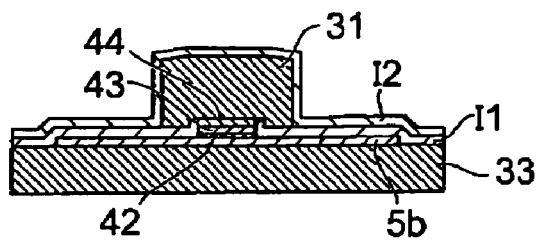
FIGS. 16A, 16B, 16C, 16D, 16E, 16F and 16G are diagrams showing steps for forming a yoke part of the element shown in FIG. 5.

First, an insulating layer I2 of $SiO_2$ or the like is formed on the lateral surface and surrounding surface of the write interconnection 31 (FIG. 16A). The $SiO_2$ layer is formed for example by CVD (chemical vapor deposition) using $Si(OC_2H_5)_4$.

Figure 16B:
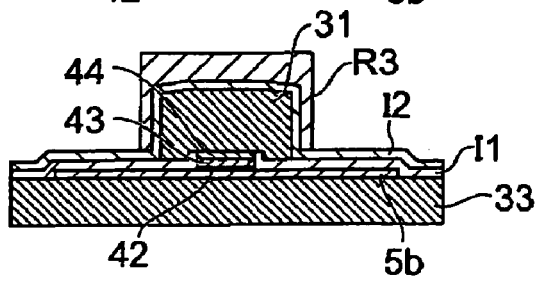

Next, a photoresist R3 is formed on and in lateral parts of the write interconnection 31 (FIG. 16B).

Figure 16C:
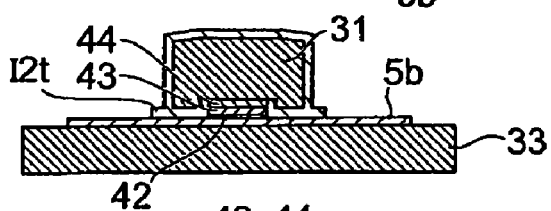

After a suitable time, the insulating layer I2 is etched from the photoresist R3 on the write interconnection 31 so as to leave the insulating layer I2 on the write interconnection 31, and in a region (lobe I2t) extending in a direction which perpendicularly intersects the longitudinal direction of the interconnection 31 of the magnetosensing layer 5b on the write interconnection 31. This etching uses dry etching (reactive ion etching) and $C_4F_8$ as etching gas. The photoresist R3 is thereby removed (FIG. 16C).

Figure 16D:
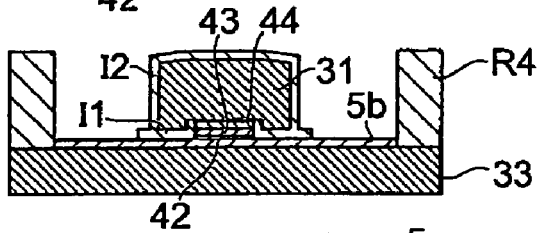
Figure 16E:
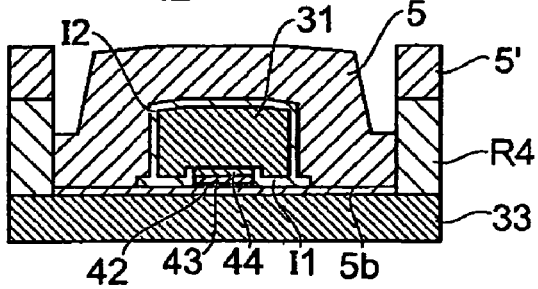
Figure 16F:
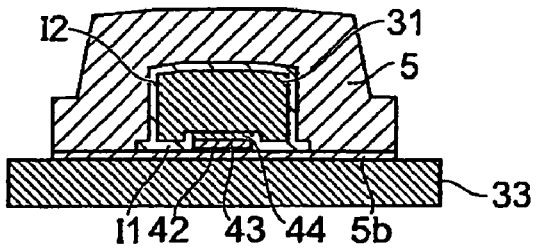

Next, a photoresist R4 is formed surrounding the circumference of one storage area (FIG. 16D). A soft magnetic material (NiFe) is then deposited on the second insulating layer I2 on the write interconnection 31 and surrounding exposed surface to form the magnetic yoke 5 (FIG. 16E). In the part wherein the lobe I2t was formed, the magnetic yoke 5 is a hollow depression inside, but coverage of soft magnetic material during deposition is good. Unnecessary soft magnetic material 5' is also deposited on the photoresist R4. Next, the photoresist R4 is lifted off and the unnecessary soft magnetic material 5' is removed (FIG. 16F). In this method, the magnetic yoke surrounding the circumference of the write interconnection 31, which is magnetically linked with the magnetosensing layer 5b, is formed leaving the insulating layer I1 underneath the write interconnection 31 and the insulating layer I2 on the lateral parts and upper part.

Figure 16G:
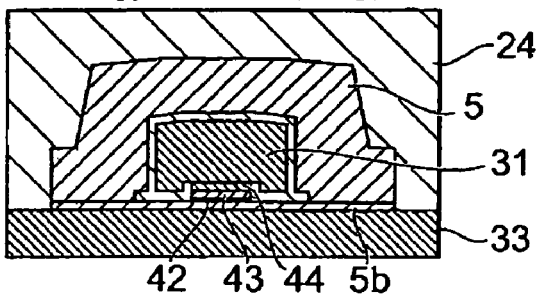

Next, a protective layer 24 of $SiO_2$ is formed on the magnetic yoke 5 (FIG. 16G). The $SiO_2$ layer may be formed by CVD using $Si(OC_2H_5)_4$. The magnetic yoke 5 is protected by the protection layer 24.

As described above, first, in the aforesaid magnetic memory, the magnetosensing layer 5b is formed on the substrate, the nonmagnetic layer 42 is formed on the magnetosensing layer 5b, and the fixed layers 43, 44 are formed on the nonmagnetic layer 42. Since the magnetosensing layer 5b is present on the substrate side, its surface area can be increased easily.

The nonmagnetic layer 42 is an insulator, and the magnetoresistance effect element functions as a TMR element comprising the magnetosensing layer 5b, insulator (42) and fixed layers 43, 44. The thickness of the nonmagnetic layer 42 is set to a thickness at which the tunnel effect is produced, for example several nm.

If the aforesaid magnetic memory 1 is provided with a write switch (transistor 32) electrically connected to the common write interconnection 31 whereof part is also used for read and the transistor 32 is switched ON, a write current can be supplied to the write interconnection 31.

If the aforesaid magnetic memory 1 is provided with a read switch (transistor 34) electrically connected to the read interconnection 33 and the transistor 34 is switched ON, a read current can be extracted from the magneto-resistance effect element by the read interconnection 33.

In the aforesaid magnetic memory, the write switch 32 is a MOSFET, ON/OFF of the MOSFET being controlled by changing the potential supplied to the gate electrode 32g of the MOSFET. In order that the write transistor 32 can pass a large current, the gate width is set wider and its dimensions are set larger than those of the read transistor. In the aforesaid construction, by using the magnetic yoke 5, the write current may be made small and the change of magnetization direction of the magnetosensing layer is well-defined, so read output precision is enhanced.

In the aforesaid construction and manufacturing method, since magnetic element and semiconductor device processes can be separated, admixture of materials used for the two processes is suppressed. Also, since there are no complex interconnections, the processes are substantially simplified.

The magnetosensing layer 5b is continuous with the magnetic yoke 5, these forming an annular magnetic body. Therefore, the magnetic field due to the current flowing through the interconnection which extends inside can be made a closed magnetic circuit, and flux reversal of the magnetosensing layer 5b can be performed efficiently.

As described above, in the magneto-resistance effect element, information is recorded by making the magnetization direction of the magnetosensing layer and fixed layer in contact with the nonmagnetic layer, parallel or anti-parallel. When they are anti-parallel, the resistance of the magneto-resistance effect element is a maximum, and when they are parallel, the resistance of the magneto-resistance effect element is a minimum, the difference between maximum and minimum being read and output. If there is a perturbance in the magnetization direction of the magnetosensing layer 5b, read output will decline, but in the aforesaid example, the current flowing through the part where the magnetization direction in the magnetosensing layer 5b is properly oriented (center of the large area) is detected, so read output improves.

In the aforesaid magnetic memory, two transistors per magneto-resistance effect element were used, but one is sufficient.

Figure 17:
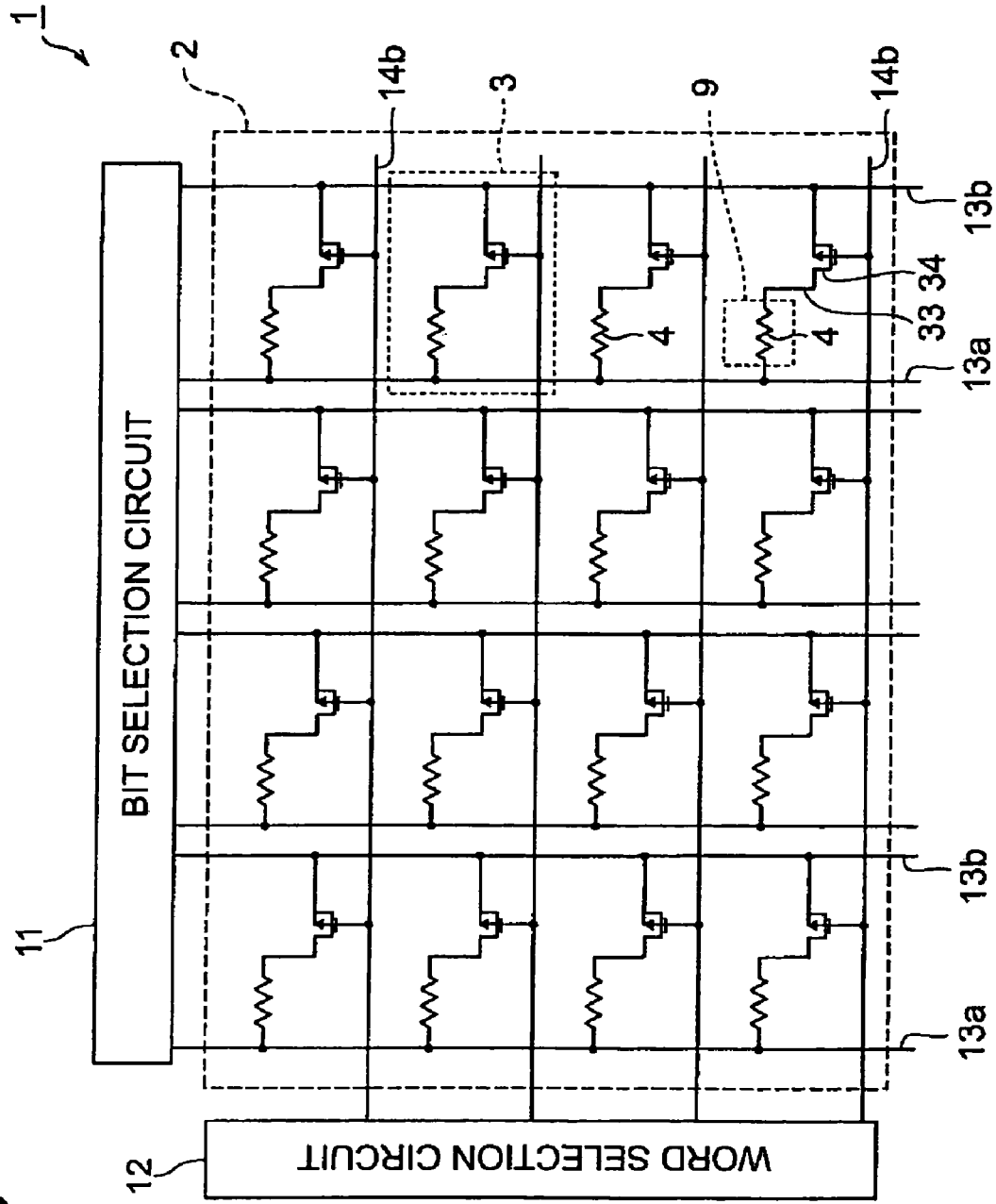
FIG. 17 is a circuit diagram of the magnetic memory 1 according to an aspect of the invention.
Figure 18:
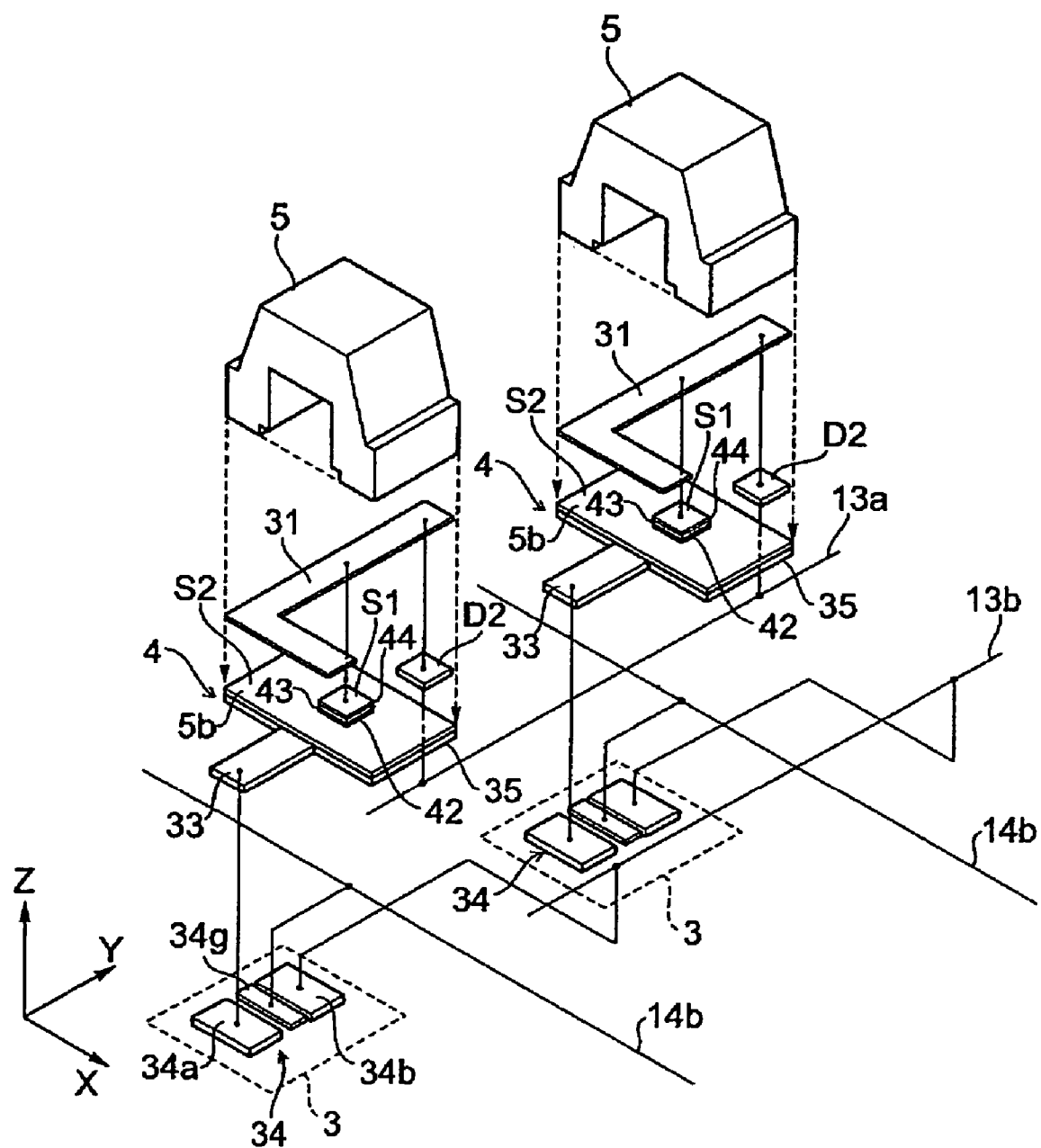
FIG. 18 is a schematic perspective view of the storage area 3 shown in FIG. 17.

FIG. 17 is a circuit diagram of the magnetic memory 1 according to this aspect, and FIG. 18 is a schematic perspective view of the storage area 3 shown in FIG. 17.

In this magnetic memory 1, the transistor 32 is omitted from that shown in FIG. 1, and data read and write is performed using one of the transistors 34. To perform data read and write using only the transistor 34, spin injection flux reversal may be used. Spin injection flux reversal is a phenomenon wherein flux reversal is produced in a ferromagnetic layer when current is passed in a direction perpendicular to a film surface of a laminate comprising a minute ferromagnetic layer/nonmagnetic layer/ferromagnetic layer. In the join interface between the ferromagnetic layer and nonmagnetic layer, the electron energy states of up-spin and down-spin are different, so the respective electron transmittances and reflectances are different, and a spin polarization current flows.

The spin-polarized electrons of the spin polarization current flowing into the ferromagnetic layer act on the electrons of the ferromagnetic layer, a torque is produced and flux reversal occurs. Write which produces spin injection flux reversal is performed by passing a current perpendicularly to the laminate film surface, the current value being $1 \times 10^7$ A/cm$^2$ or more. Write is performed by passing a current greater than a predetermined value, and read is performed by passing a current less than the predetermined value, through the transistor 34. In this case, owing to the simple circuit construction, a high level of integration can be achieved. The write current value is preferably from $1 \times 10^7$ A/cm$^2$ to $5 \times 10^7$ A/cm$^2$, and it is required that write current>read current. To avoid a malfunction, the write current is preferably 5 times, and more preferably 10 times, the read current.

Various aspects of the invention have been described, but they all share the common feature that the surface area of the fixed layers 43, 44 is smaller than the surface area of the magnetosensing layer 5b.

This invention can be used as a magnetic memory and a method of manufacturing same.

What is claimed is:

1. A magnetic memory comprising:
a plurality of storage areas in a two-dimensional array, each of the plurality of storage areas including:
a single transistor;
a magneto-resistance effect element comprising a magnetosensing layer, nonmagnetic layer and fixed layer laminated together;
a write interconnection generating magnetic force lines supplied to the magnetosensing layer;
a magnetic yoke completely surrounding the circumference of the write interconnection; and
a read interconnection electrically connected to the magneto-resistance effect element; and
a controller that provides a first current to each transistor to generate a spin injection flux reversal during data writing, and a second current to each transistor during data reading, wherein,
in the magneto-resistance effect element, the surface area of the fixed layer is smaller than the surface area of the magnetosensing layer,
the single transistor being electrically connected to the magneto-resistance effect element in the corresponding storage area, and
the first current is greater than a predetermined value, and the second current is less than the predetermined value.

2. The magnetic memory according to claim 1, wherein the magnetosensing layer is formed on a substrate, the nonmagnetic layer is formed on the magnetosensing layer and the fixed layer is formed on the nonmagnetic layer.

3. The magnetic memory according to claim 1, wherein the nonmagnetic layer is an insulator.

4. The magnetic memory according to claim 1, wherein a value of the first current is five times greater than a value of the second current.

5. The magnetic memory according to claim 1, wherein a value of the first current is more than ten times greater than a value of the second current.

* * * * *